United States Patent [19]

Brusewitz

[11] Patent Number: 4,922,510

[45] Date of Patent: May 1, 1990

[54] METHOD AND MEANS FOR VARIABLE LENGTH CODING

[75] Inventor: Harald Brusewitz, Farsta, Sweden

[73] Assignee: Televerket, Farsta, Sweden

[21] Appl. No.: 156,683

[22] Filed: Feb. 17, 1988

[30] Foreign Application Priority Data

Feb. 20, 1987 [SE] Sweden .................................. 8700725

[51] Int. Cl.⁵ .............................................. H04N 1/413
[52] U.S. Cl. ........................................ 375/122; 358/133
[58] Field of Search ............................ 375/31, 33, 122;
370/83; 358/133, 261, 261.1, 261.2, 261.4;
379/97, 100; 341/64, 67, 106

[56] References Cited

U.S. PATENT DOCUMENTS

| 4,125,861 | 11/1978 | Mounts et al. | 358/133 |
| 4,541,012 | 9/1985 | Tescher | 358/133 |
| 4,677,671 | 6/1987 | Galand et al. | 375/122 |
| 4,706,265 | 11/1987 | Furukawa | 375/122 |

OTHER PUBLICATIONS

"Scene Adaptive Coder" by Wen-Hsiung Chen and William K. Pratt, IEEE Transactions on Communications, vol. Com32, No. 3, Mar. 1984.
"VLC Set Proposal for n×384kbits/s" by CCITT Study Group XV, Working Part XV/1, Specialists Group on Coding for Visual Telepony, Draft Document #122, Jun. 1986.

Primary Examiner—Benedict V. Safourek
Attorney, Agent, or Firm—Pollock, Vande Sande & Priddy

[57] ABSTRACT

A method and a device are disclosed for variable length coding and decoding of an information block of input signals, with the information being concentrated at the beginning of the block and the block being terminated by a continuous succession of zero words. Two code trees are utilized for coding and decoding the block. The first of the code trees is utilized for coding and decoding the first part of the block up to and including the word before the last non-zero and an end of the block character EOB, and the second code tree is specially designed for coding and decoding the last non-zero word. A switching device provides for switching between the two code trees and associated devices after the character EOB and before the last non-zero word.

6 Claims, 3 Drawing Sheets

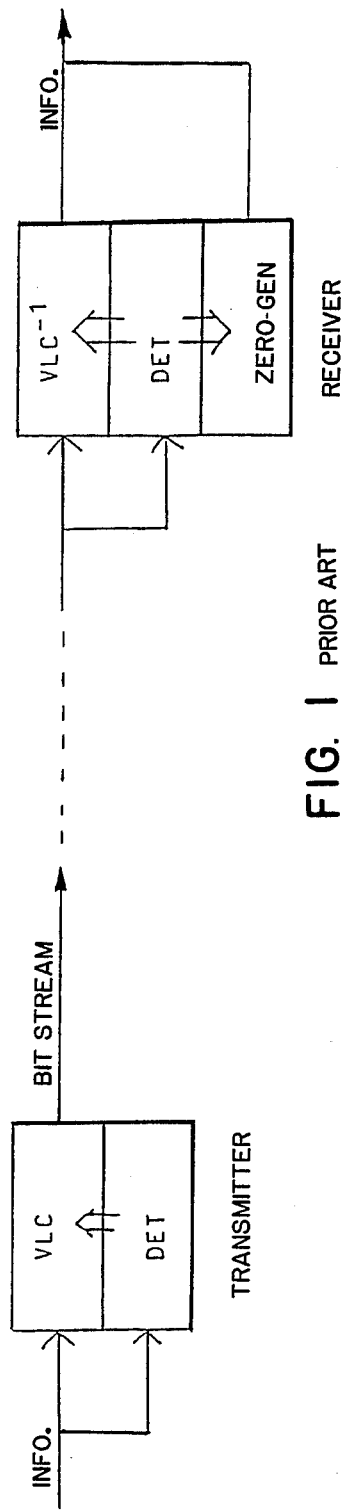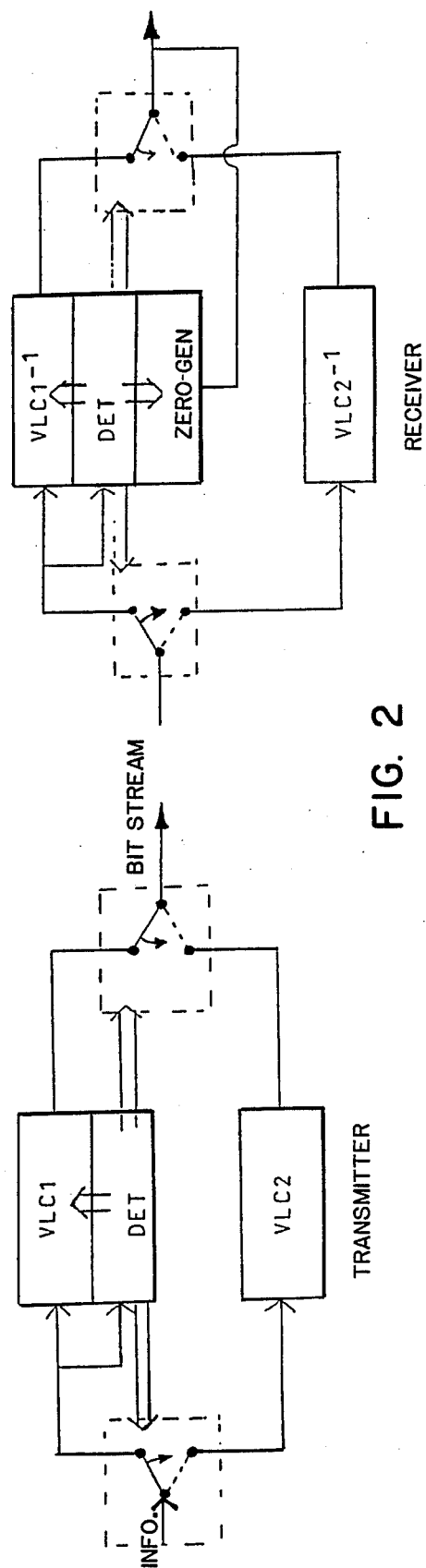
FIG. 1 PRIOR ART
FIG. 2

FIG. 4a

| 1 | 2 | 3 | 4 | 5 | 6 | 7 | 8 | 9 | ... | 64 | |
|---|---|---|---|---|---|---|---|---|---|---|---|
| 0 | -2 | 1 | 0 | 0 | -1 | 0 | 0 | 0 | 0 | 0 | 0 |

FIG. 4b

| | | | | | | | | Σ |
|---|---|---|---|---|---|---|---|---|
| PICTURE INFO. | 0 | -2 | 1 | 0 | 0 | -1 | (EOB) | |
| BIT STREAM | 0 | 11101 | 100 | 0 | 0 | 101 | 110 | 17 |

FIG. 4c

SWITCHING ↓

| | | | | | | | | Σ |
|---|---|---|---|---|---|---|---|---|
| PICTURE INFO. | 0 | -2 | 1 | 0 | 0 | (EOB) | -1 | |
| BIT STREAM | 0 | 11101 | 100 | 0 | 0 | 110 | 01 | 16 |

FIG. 4d

| LAST NON-ZERO | | -1 | 1 | 2 | 3 |
|---|---|---|---|---|---|
| CODE | A | 101 | 100 | 11100 | 111100 |
| | B | 110 | 0 | 100 | 11100 |
| | C | 10 | 0 | 1100 | 11100 |
| | D | 01 | 00 | 100 | 1100 |
| BITGAIN | B | 0 | 2 | 2 | 1 |
| | C | 1 | 2 | 1 | 1 |
| | D | 1 | 1 | 2 | 2 |

/ 
METHOD AND MEANS FOR VARIABLE LENGTH CODING

FIELD OF THE INVENTION

The present invention relates to a method and a means for variable length coding, especially for picture coding moving pictures.

TECHNICAL BACKGROUND

As is well known, transmitting picture information about moving pictures on telephone wires without any adaption of the information is very space-requiring. Therefore, a number of methods have been developed for compressing the information without deteriorating the image quality too much.

Differential pulse code modulation or DPCM coding is such a method of compressing the information. In this method the knowledge that there are only small differences between two successive images is utilized. In the receiver a predictor predicts what the next image will look like by means of the preceding image. A difference is formed and only the prediction error has to be transmitted to the receiver, which contains a similar predictor for reconstructing the original image.

In transform coding the image is divided into blocks of e.g. eight times eight picture elements or PEL. The image content is mathematically transformed into so called transform coefficients which are then quantized. The coefficients for gray areas are zero, according to this method, and do not have to be transmitted over the telephone wires.

Hybrid coding is a third method, which is a combination of DPCM and transform coding. According to this method the same difference is formed as in DPCM coding, which difference is then transformed and quantized. The information is then transmitted in an especially suitable form, since the image information is concentrated in the first coefficients in the block while the remaining coefficients are zero.

Then, the information can be coded with variable length coding, VLC. The coefficients or the words can take on values between e.g., −128 and +127, but the probability for the different values is concentrated around zero, i.e. the probability for the value zero is greater than for the values ±1 which is greater than the probability for the values ±2, etc. This is utilized in VLC by coding the most probable values such that they get the least number of bits, and values having lower probability get a greater number of bits. For the coding and the decoding, special schedules, so called code trees, are used. However, not all the coefficients in the block are coded, since it is known that the block ends by a continuous succession of zeros, but the last non-zero is detected and coded and then a character EOB (end of block) is transmitted, defining that the remainder of the block only consists of zeros. EOB is also part of the code tree.

The three methods above are described more closely in Televerket's technical periodical, Tele, vol. 91, No. 4, 1985, pages 1–7, and the periodical Elteknik, No. 14, 1986, pages 48–52.

A drawback in this previous method is that the same code tree is used for the last non-zero word, though it is known that it cannot be zero or EOB. According to the present invention it is realized that it would be efficient to use a second code tree, especially designed for the last non-zero word. This can then be constructed especially advantageously in view of the possible values for the last word and their probabilities. As a result, 1–2 bits per block can be saved in sending the same information, implying a saving of appr. 3%.

SUMMARY OF THE INVENTION

Thus, the object of the invention is to make the variable length coding more efficient, which is achieved by a method for variable length coding a block with uncoded information, the uncoded information having a structure with the information carrying words being concentrated at the beginning of the block and terminated by a continuous succession of zeros.

Characteristic of the invention is that the last non-zero word is detected and that two code trees are utilized, the first code tree being used for coding the first part of the block up to and including the word before the last-zero word, that EOB is then transmitted and the encoder is switched to the second code tree for coding the last word.

The invention also relates to a method for decoding with variable length coding, which similarly utilizes two code trees. The switching between the code trees is done after EOB has been detected.

The invention also relates to a transmitting means for variable length coding, comprising a detecting means for the last non-zero in a block. Characteristic of the invention is that the means further comprises two decoding means, the first of which utilizes a first code tree for coding the words in a first part of the block up to and including the word before the last non-zero, and the second decoding means utilizes a second code tree for coding the last non-zero in the block, a swithing means which, after EOB has been transmitted, switches the input signal from the input of the first decoding means and simultaneously switches the output signal from the first to the second decoding means.

The present invention also relates to a receiving means for variable length coding, comprising features corresponding to those of the transmitting means.

BRIEF DESCRIPTION OF THE DRAWINGS AND THE TABLES

The invention will now be described with reference to the appended drawings and tables.

FIG. 1 discloses a transmitting means and a receiving means according to prior art;

FIG. 2 discloses a transmitting means and a receiving means according to the present invention, and FIG. 3 discloses examples of various code trees.

FIG. 4a gives an example of an information block,

FIG. 4b discloses the result of coding the block in FIG. 4a according to prior art, FIG. 4c discloses the result of coding the same block according to the present invention by means of code tree D in FIG. 3, and FIG. 4d gives the bit gain according to the present invention compared with prior art using the code trees in FIG. 3.

DETAILED DESCRIPTION OF THE INVENTION

Figure 3:
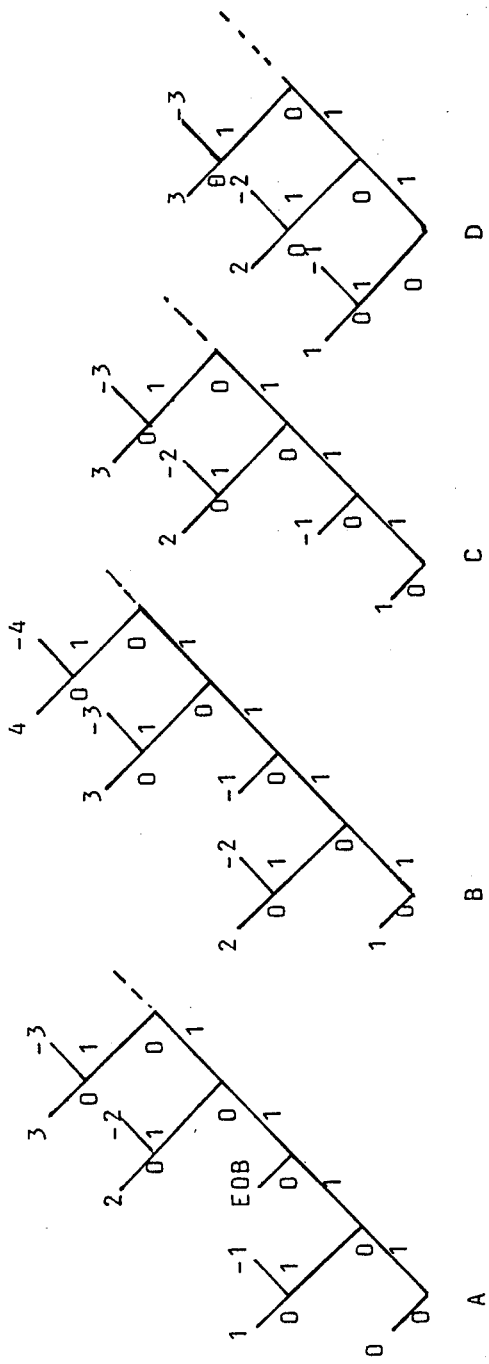

In FIG. 1 there is described a transmitter and a receiver according to prior art. The transmitter comprises a variable length coding means VLC and a detecting means DET and the receiver comprises a variable length decoding means $VLC^{-1}$, a detecting means and a means for generating zeros, ZEROGEN. An input signal comes to the transmitter from a conventional hybrid coding means (not shown), which signal is divided into one block for each picture element. A block contains 64 words, which can have e.g. the values shown in FIG. 4a. In coding the words in the block a so called code tree is used to determine the code for each word. In this case, the code tree in FIG. 3 is used and thereby the words get the codes shown in FIG. 4b. The detecting means detects the last non-zero in the block and orders the encoder to code EOB directly after the last non-zero. Control signals are indicated in the figures by wide arrows. EOB is coded similarly as the other words with the same code tree. The remaining zeros in the block are not coded and EOB (end of block) terminates each block. The codes form bit streams which are transmitted to the receiver.

In FIG. 4b there is shown the result of such a coding of the values in FIG. 4a. Hence, the number of bits required are 17.

Into the receiver according to prior art the bit stream enters from the transmitting means and the decoding takes place in the decoder by means of the same code tree. EOB is detected in the detecting means and the remainder of the block is filled with zeros by the zero generating means. The decoded information then proceeds to a hybrid decoder for reconstructing the orignal image.

In FIG. 2 there is described an embodiment of the present invention comprising a transmitter and a receiver. The transmitter comprises two encoding means VLC1 and VLC2, a detecting means and a switching means. The switching means controls which encoder, VLC1 or VLC2, is connected at the input to and the output from the transmitter. At the beginning of each transmission the switch is in the upward position, shown by a continuous line, and the first encoder is connected. The encoder treats the display information by means of the same code tree as in prior art, i.e. A in FIG. 3. Also now, the detecting means detects the last non-zero in a block, but it orders the first encoder to code EOB before the last non-zero, instead of after according to prior art, and after EOB has been coded the switch is ordered to the second position shown by a broken line, and the second encoder VLC2 comes into function for coding the last non-zero. VLC2 thereby uses another code tree, e.g. any of the trees B, C or D in FIG. 3. The code for the last non-zero terminates the whole block.

The receiver according to the invention comprises two VLC decoders, VLC$^{-1}$ and VLC$^{-1}$, a detecting means DET and a zero generating means. Similar to the transmitting means, the switching means controls which decoder, VLC1$^{-1}$ or VLC2$^{-1}$, is connected at the input to and the output from the receiver. The receiver operates analogously to the transmitter and thus, the switcher is in the upward position at the beginning of each block and the decoding takes place by means of the first code tree, i.e. A in FIG. 3. After EOB has been detected, the switcher is ordered to the second position and the last non-zero word is decoded by means of any of the other code trees B, C or D in FIG. 3, of course this other code tree should be the same tree which was utilized in the transmitter. Zeros are then generated for filling the remainder of the block and the information proceeds to the hybrid decoding means for reconstructing the original image.

In FIG. 4c there is shown the result of the coding by means of the transmitter according to the present invention. The bit stream is the same as previously up to and including the word before the last non-zero, EOB is then transmitted and the switching is switched to VLC2, which codes the last non-zero, in this example by means of code tree D in FIG. 3. The number of bits are 16 and in this example the bit gain is one bit.

In FIG. 4d a comparison is made between prior art, all the time using code tree A in FIG. 3, and the present invention, using code trees B, C or D in FIG. 3, for different values of the last non-zero. Hence, the bit gain in most cases is 2 or 1, but zero in the case B if the last non-zero is $-1$. However, a special advantage with code tree B is, except for the codes having different implication, that it has exactly the same structure as code tree A, which gives technical advantages in programming. To calculate the most economical code tree the probabilities of the different values are used, which the last non-zero can take on, $\pm 1$, $\pm 2$, etc.

From the preceding description a skilled person realizes how the present invention should be constructed by means of components known per se and the invention is limited only by the claims below.

What is claimed is:

1. A method of transmitting in variable length coding a block with uncoded information, the information having a structure including information carrying non-zero words being concentrated in the beginning of the block and terminated by a continuous succession of zero words, the method comprising the steps of:
   detecting the last non-zero word;
   using a first code tree to code the first part of the block up to and including the word before the last non-zero word, and to code an end of the block character (EOB) for indicating the end of the block; and
   switching to a second code tree not having any zero or EOB codes to code the last non-zero word.

2. A method of receiving in variable length coding the received information being coded according to claim 1, comprising the steps of:
   detecting the end of block character (EOB);
   using the first code tree to decode the first part of the block up to and including the EOB;
   switching to the second code tree to decode the last non-zero word; and
   completing the block with zero words.

3. Variable length coding transmitting means for transmitting and encoding a block with uncoded information, the information having a structurre including information carrying non-zero words being concentrated in the beginning of the block and terminated by a continuous succession of zero words, the transmitting means comprising:
   means for detecting the last non-zero word in the block, wherein the detecting means includes:
   (a) a first coding means utilizing a first code tree for coding the words in a first part of the block up to and including the word before the last non-zero word, the first coding means further coding an end of the block character (EOB) for indicating the end of the block;
   (b) a second coding means utilizing a second code tree for coding the last non-zero word in the block, the second code tree not having any zero or EOB codes;

a switching means for switching picture information from the input of the first coding means to the input of the second coding means after the EOB has been transmitted in coded form, and simultaneously switching the output signal of the transmitting means from the output of the first coding means to the output of the second coding means.

4. Variable length coding transmitting means according to claim 3, wherein the second code tree utilized in the second coding means has the same structure as the first code tree, but with different codes.

5. Variable length coding receiving means for receiving and decoding signals from the transmitting means of claim 3, comprising:

means for detecting the EOB, wherein the EOB detecting means includes:
(a) a first decoding means utilizing the first code tree for decoding the words in the first part of the block up to and including the EOB;
(b) a second decoding means utilizing another code tree, corresponding to the second code tree utilized by the second coding means in the transmitting means, for decoding the last non-zero word in the block;
a switching means for switching the receiving signal from the input of the first decoding means to the input of the second decoding means, and simultaneously switching the output signal of the receiving means from the output of the first decoding means to the output of the second decoding means after the EOB has been decoded.

6. Variable length coding receiving means for receiving and decoding signals from the transmitting means of claim 4, comprising:

means for detecting the EOB, wherein the EOB detecting means includes:
(a) a first decoding means utilizing the first code tree for decoding the words in the first part of the block up to and including the EOB;
(b) a second decoding means utilizing another code tree, corresponding to the second code tree utilized by the second coding means in the transmitting means, for decoding the last non-zero word in the block;
a switching means for switching the receiving signal from the input of the first decoding means to the input of the second decoding means, and simultaneously switching the output signal of the receiving means from the output of the first decoding means to the output of the second decoding means after the EOB has been decoded.

* * * * *